US008519538B2

(12) United States Patent
Hsia et al.

(10) Patent No.: US 8,519,538 B2
(45) Date of Patent: Aug. 27, 2013

(54) LASER ETCH VIA FORMATION

(75) Inventors: Hsing-Kuo Hsia, Jhubei (TW);
Chih-Kuang Yu, Chiayi (TW);
Ching-Hua Chiu, Hsinchu (TW); Troy Wu, Yonghe (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 200 days.

(21) Appl. No.: 12/768,911

(22) Filed: Apr. 28, 2010

(65) Prior Publication Data

US 2011/0266674 A1 Nov. 3, 2011

(51) Int. Cl.
*H01L 29/40* (2006.01)

(52) U.S. Cl.
USPC ........... 257/745; 257/782; 257/774; 257/676; 438/604; 438/629; 438/637; 438/638; 438/640; 438/668; 438/672; 438/675

(58) Field of Classification Search
USPC ................. 257/745, 782, 774, 676; 438/604, 438/629, 637, 638, 640, 668, 672, 675
See application file for complete search history.

(56) References Cited

U.S. PATENT DOCUMENTS

| | | | |
|---|---|---|---|
| 5,391,917 A | 2/1995 | Gilmour et al. | |
| 5,510,298 A | 4/1996 | Redwine | |
| 5,527,739 A * | 6/1996 | Parrillo et al. | 438/627 |
| 5,767,001 A | 6/1998 | Bertagnolli et al. | |
| 5,998,292 A | 12/1999 | Black et al. | |
| 6,184,060 B1 | 2/2001 | Siniaguine | |
| 6,322,903 B1 | 11/2001 | Siniaguine et al. | |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,790,775 B2 * | 9/2004 | Fartash | 438/667 |
| 6,800,930 B2 | 10/2004 | Jackson et al. | |
| 6,841,883 B1 | 1/2005 | Farnworth et al. | |
| 6,882,030 B2 | 4/2005 | Siniaguine | |
| 6,908,784 B1 * | 6/2005 | Farnworth et al. | 438/106 |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |

(Continued)

*Primary Examiner* — Fernando L Toledo
*Assistant Examiner* — Mohammed Shamsuzzaman
(74) *Attorney, Agent, or Firm* — Haynes and Boone, LLP

(57) ABSTRACT

The present disclosure provides methods for forming semiconductor devices with laser-etched vias and apparatus including the same. In one embodiment, a method of fabricating a semiconductor device includes providing a substrate having a frontside and a backside, and providing a layer above the frontside of the substrate, the layer having a different composition from the substrate. The method further includes controlling a laser power and a laser pulse number to laser etch an opening through the layer and at least a portion of the frontside of the substrate, filling the opening with a conductive material to form a via, removing a portion of the backside of the substrate to expose the via, and electrically coupling a first element to a second element with the via. A semiconductor device fabricated by such a method is also disclosed.

21 Claims, 9 Drawing Sheets

(56) References Cited

U.S. PATENT DOCUMENTS

| | | | |
|---|---|---|---|
| 7,071,546 B2 | 7/2006 | Fey et al. | |
| 7,111,149 B2 | 9/2006 | Eilert | |
| 7,122,912 B2 | 10/2006 | Matsui | |
| 7,157,787 B2 | 1/2007 | Kim et al. | |
| 7,193,308 B2 | 3/2007 | Matsui | |
| 7,262,495 B2 | 8/2007 | Chen et al. | |
| 7,297,574 B2 | 11/2007 | Thomas et al. | |
| 7,335,972 B2 | 2/2008 | Chanchani | |
| 7,355,273 B2 | 4/2008 | Jackson et al. | |
| 7,417,325 B2 * | 8/2008 | Farnworth et al. | 257/780 |
| 7,514,797 B2 | 4/2009 | Chen et al. | |
| 7,575,999 B2 * | 8/2009 | Benson et al. | 438/637 |
| 8,018,045 B2 * | 9/2011 | En et al. | 257/700 |
| 8,324,101 B2 * | 12/2012 | Akram et al. | 438/667 |
| 2001/0053567 A1 * | 12/2001 | Akram et al. | 438/127 |
| 2002/0151171 A1 * | 10/2002 | Furusawa | 438/660 |
| 2006/0027934 A1 * | 2/2006 | Edelstein et al. | 257/774 |
| 2006/0275949 A1 * | 12/2006 | Farnworth et al. | 438/106 |
| 2007/0262464 A1 * | 11/2007 | Watkins et al. | 257/774 |
| 2008/0111213 A1 * | 5/2008 | Akram et al. | 257/621 |
| 2008/0284037 A1 * | 11/2008 | Andry et al. | 257/774 |
| 2008/0290525 A1 * | 11/2008 | Anderson et al. | 257/774 |
| 2009/0243074 A1 | 10/2009 | Ramiah et al. | |
| 2010/0013073 A1 * | 1/2010 | Andry et al. | 257/686 |
| 2010/0015782 A1 * | 1/2010 | Yu et al. | 438/463 |
| 2011/0233777 A1 * | 9/2011 | Akram et al. | 257/738 |

* cited by examiner

LASER ETCH VIA FORMATION

BACKGROUND

The semiconductor industry has experienced continued rapid growth due to continuous improvements in the integration density of various electronic components (i.e., transistors, diodes, resistors, capacitors, etc.). For the most part, this improvement in integration density has come from reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D integrated circuit formation, there are physical limits to the density that can be achieved in two dimensions. One of these limits is the minimum size needed to make these components. Also, when more devices are put into one chip, more complex designs are required. An additional limit comes from the significant increase in the number and length of interconnections between devices as the number of devices increases.

In an attempt to further increase circuit density, three-dimensional (3D) integrated circuits (ICs) have been investigated. In a typical formation process of a 3D IC, two dies are bonded together and electrical connections are formed between each die and contact pads on a substrate. For example, one attempt involved bonding two dies on top of each other. The stacked dies were then bonded to a carrier substrate and wire bonds electrically coupled contact pads on each die to contact pads on the carrier substrate.

Such devices have required the formation of high aspect ratio vias for electrical connection between frontside and backside dies. Disadvantageously, prior etching techniques for via formation, such as deep reactive ion etching (DRIE), has been time consuming, required lithography for pattern definition, and caused non-uniform sidewalls (e.g., periodic ripples) which could lead to integration inefficiencies in subsequent process steps such as dielectric layer deposition, electroplating, and the like.

Accordingly, there is a need for improved high aspect ratio via formation in semiconductor device fabrication.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

SUMMARY

Figure 1:
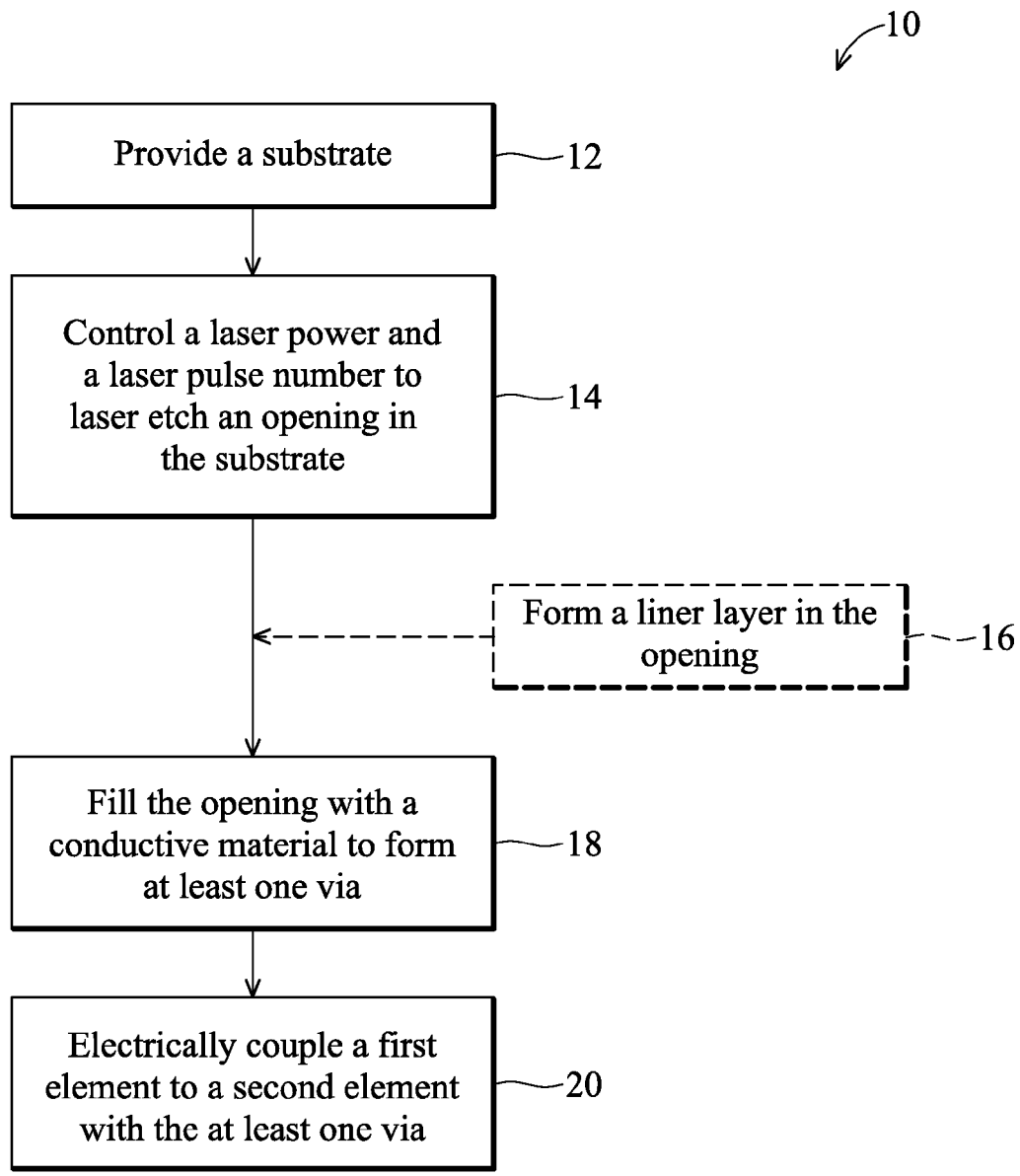
FIG. 1 is a flowchart illustrating a method of fabricating a semiconductor device according to various aspects of the present disclosure.

The present disclosure provides for many different embodiments. One of the broader forms of the present disclosure involves a method of fabricating a semiconductor device. The method includes providing a substrate having a frontside and a backside, and providing a layer above the frontside of the substrate, the layer having a different composition from the substrate. The method further includes controlling a laser power and a laser pulse number to laser etch an opening through the layer and at least a portion of the frontside of the substrate, filling the opening with a conductive material to form a via, removing a portion of the backside of the substrate to expose the via, and electrically coupling a first element to a second element with the via.

Another of the broader forms of the present disclosure involves another method of fabricating a semiconductor device, the method including providing a substrate having a frontside and a backside, and providing a plurality of layers above the frontside of the substrate, the layers having different compositions from the substrate. The method further includes controlling a laser power and a laser pulse number to laser etch an opening through the plurality of layers and at least a portion of the frontside of the substrate, wherein a taper angle of the opening is tuned by the laser power and the laser pulse number. The method continues with filling the opening with a conductive material to form a via, removing a portion of the backside of the substrate to expose the via, and electrically coupling a first element to a second element with the via.

Yet another of the broader forms of the present disclosure involves an apparatus that includes a semiconductor device. The semiconductor device includes a first die having a first surface and a second surface opposite the first surface, and a plurality of vias formed through a plurality of openings laser-etched through the first surface of the first die, each opening of the plurality of openings having an aspect ratio ranging between about 0.25 and about 20. The device further includes a first set of redistribution lines electrically coupling semiconductor components of the first die to the plurality of vias, and a second die having a first surface and a second surface opposite the first surface. The first surface of the second die has contact pads, the first set of redistribution lines electrically coupling the contact pads of the second die to the plurality of vias.

DETAILED DESCRIPTION

The present disclosure relates generally to the fabrication of a semiconductor device, and more particularly, to methods for providing vias in a semiconductor substrate and devices fabricated by such methods.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
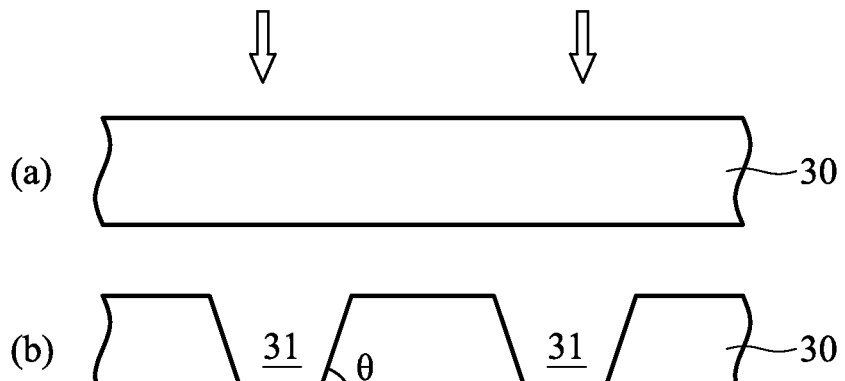
FIG. 2 illustrates laser etching an opening through a substrate of a semiconductor device according to aspects of the present disclosure.
Figure 3:
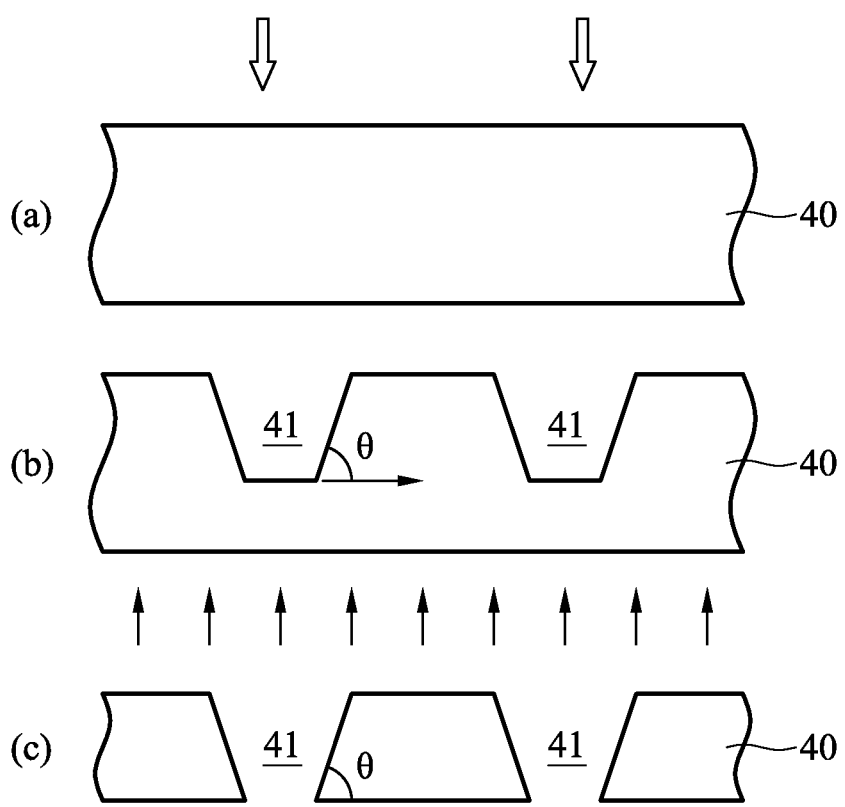
FIG. 3 illustrates laser etching an opening through a portion of a substrate and then exposing the opening according to aspects of the present disclosure.
Figure 5:
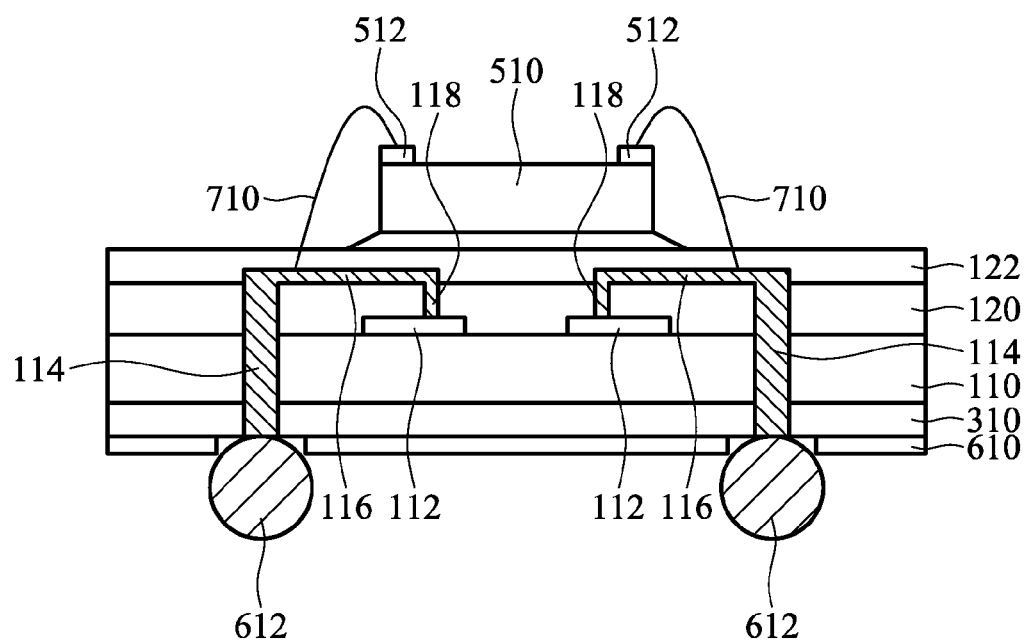
FIG. 5 illustrates another embodiment of a semiconductor device according to various aspects of the present disclosure.
Figure 6A:
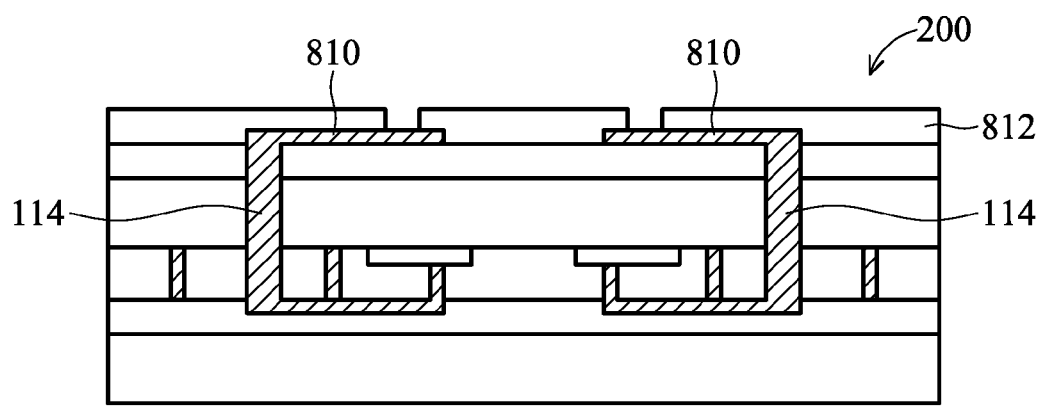
FIGS. 6A-6C illustrate sectional views of stages in forming another semiconductor device according to various aspects of the present disclosure.
Figure 6B:
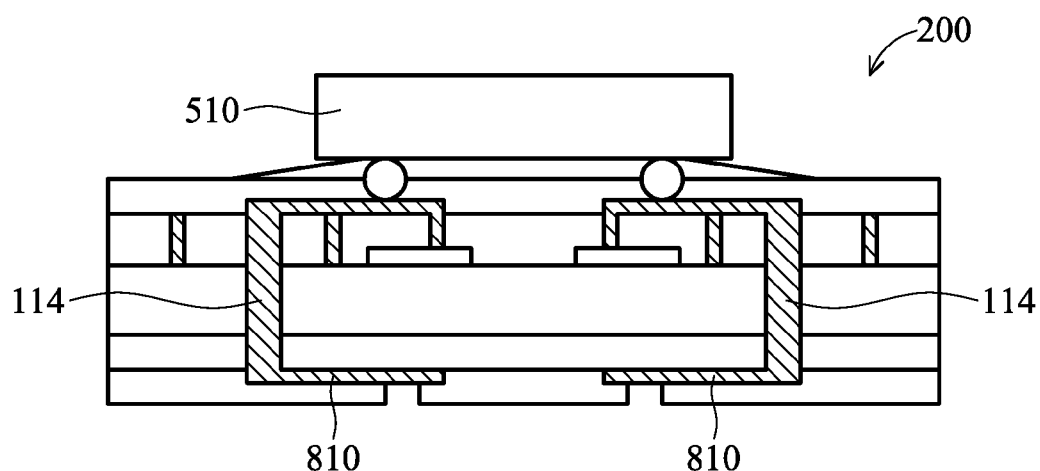
Figure 6C:
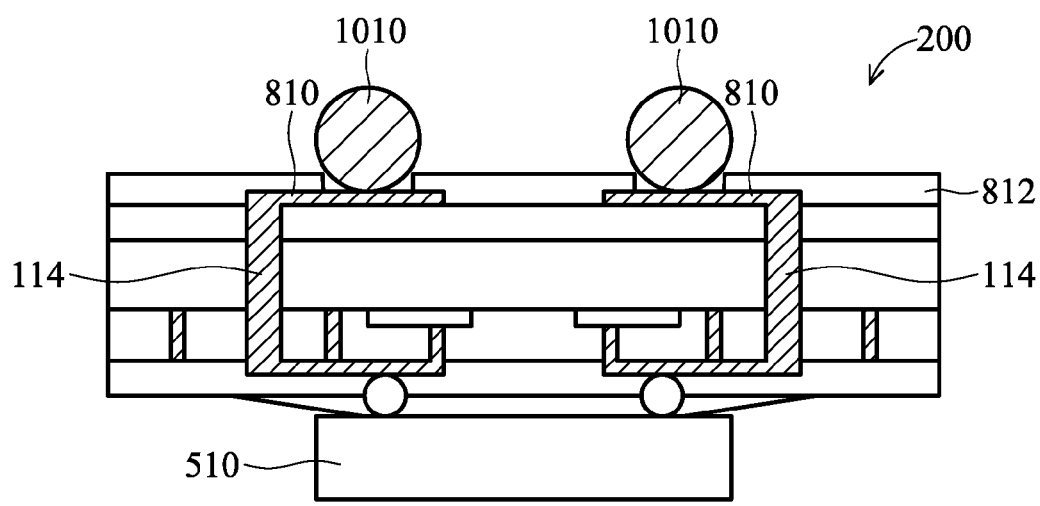
Figure 7:
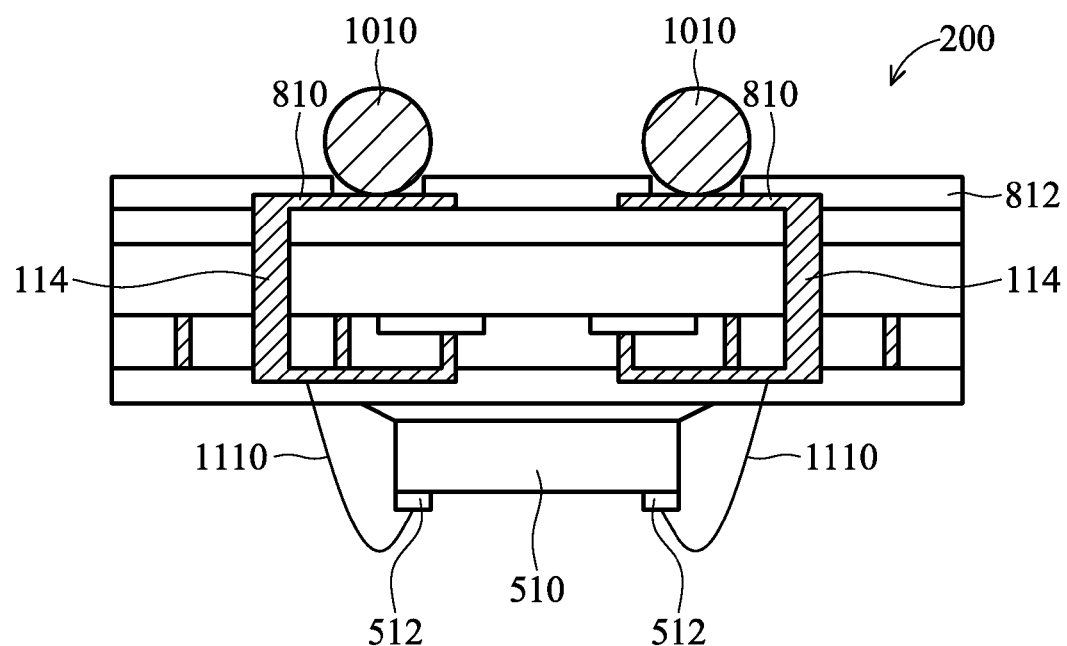
FIG. 7 illustrates yet another embodiment of a semiconductor device according to various aspects of the present disclosure.

Illustrated in FIG. 1 is a flowchart of an example method for fabricating a semiconductor device. FIGS. 2 and 3 illustrate different methods of controlling a laser power and a laser pulse number to laser etch an opening through at least a portion of a substrate in accordance with various aspects of the present disclosure. Illustrated in FIGS. 4A-4I are cross-sectional views of stages in forming a semiconductor device according to various aspects of the present disclosure. FIG. 5 illustrates another embodiment of a semiconductor device according to various aspects of the present disclosure, FIGS. 6A-6C illustrate sectional views of stages in forming another semiconductor device according to various aspects of the present disclosure, and FIG. 7 illustrates yet another embodiment of a semiconductor device according to various aspects of the present disclosure. Throughout the various views and illustrative embodiments of the present disclosure, like reference numbers are used to designate like elements.

Referring first to FIG. 1, a method 10 is shown for forming a semiconductor device. The method 10 includes providing a substrate at block 12, and controlling a laser power and a laser pulse number to laser etch an opening through at least a portion of the substrate at block 14. Optionally, the method further includes forming a liner layer in the laser-etched opening at block 16. The method continues with filling the opening with a conductive material to form a via at block 18, and electrically coupling a first element to a second element with the via at block 20.

The semiconductor device may include an integrated circuit (IC) chip (both 2D and 3D IC designs), a system on chip (SoC), or portion thereof, that may include various passive and active microelectronic devices, such as resistors, capacitors, inductors, diodes, metal-oxide-semiconductor field effect transistors (MOSFET), complementary MOS (CMOS) transistors, bipolar junction transistors (BJT), laterally diffused MOS (LDMOS) transistors, high power MOS transistors, FinFET transistors, or other types of transistors. It is understood that the figures may have been simplified for a better understanding of the inventive concepts of the present disclosure. Accordingly, it should be noted that additional processes may be provided before, during, and after the method of FIG. 1, and that some other processes may only be briefly described herein.

Referring now to FIGS. 2 and 3, different methods of laser etching an opening through a substrate 30 and a portion of a substrate 40 are illustrated, respectively, in accordance with various aspects of the present disclosure. The substrates 30 and 40 each include silicon. The substrates may alternatively or additionally include other elementary semiconductor material such as germanium, diamond, ceramic, and/or sapphire. The substrates may also include a compound semiconductor material such as silicon carbide, gallium arsenide, gallium nitride, indium arsenide, and/or indium phosphide. The substrates may include an alloy semiconductor such as silicon germanium, silicon germanium carbide, gallium arsenic phosphide, and/or gallium indium phosphide. The substrates may also include various p-type doped regions and/or n-type doped regions. All doping may be implemented using a process such as ion implantation or diffusion in various steps and techniques. The substrates may include conventional isolation features, known in the art, to separate different devices formed in the substrate. The substrate may include other features such as an epitaxial layer, a semiconductor on insulator (SOI) structure, or combinations thereof.

Block arrows in FIGS. 2(a) and 3(a) illustrate pulsating laser light at a controlled laser power and a laser pulse number to etch through the substrate 30 and a portion of substrate 40, respectively. The laser power and the laser pulse number are controlled parameters for the via formation, and may be inversely related, as decreased pulse number is needed with increased laser power to create a similar opening, and increased pulse number is needed with decreased laser power to create a similar opening. In one example, the pulse number may be controlled by manipulating a wafer stage or a laser shutter. The laser is operated in a pulse mode to bombard an etch surface at a pulsing frequency, thereby allowing for improved etching rates and smooth sidewall formation.

The laser light may be provided by various lasers, including but not limited to KrF, XeF, XeCl, $CO_2$, Nd:YAG, and He:Cd lasers. The laser light ma also be provided at various wavelengths, including but not limited to KrF at 248 nm, XeF at 351 nm, XeCl at 308 nm, $CO_2$ at 10600 nm, Nd:YAG at 1064 nm, 532 nm, or 355 nm, and He:Cd at 325 nm. The laser light may be provided within a range of power, from about 1 milliwatt to about 100 kilowatts in one example. In a further example, a laser power for a $CO_2$ laser may range from several milliwatt to hundreds of kilowatts, a laser power for a Nd:YAG laser may range from one milliwatt to 45 watts, and a laser power for a KrF laser may be less than 100 watts. The laser light may be provided within a range of pulse number, from about 1 to 300 in one example.

The laser power, the laser pulse number, the type of laser, and/or wavelength of laser light may be tuned to control the diameter and depth of laser-etched openings 31 and 41. In one example, laser-etched openings may have a diameter ranging between about 40 micron and about 140 micron, and a depth ranging between about 10 micron and about 800 micron, with an aspect ratio ranging between about 0.25 and about 20. In yet another example, laser-etched openings may have a diameter ranging between about 40 micron and about 140 micron, and a depth ranging between about 200 micron and about 400 micron, with an aspect ratio ranging between about 5 and about 10.

Laser-etched openings 31 and 41 having tapered angles θ are illustrated in FIGS. 2(b) and 3(b), respectively. Tapered angles θ are measured from the horizontal plane and may range between about 60 degrees and about 90 degrees (i.e., vertical sidewalls). The tapered angle of laser-etched openings 31 and 41 may be tuned by the type of laser, wavelength of laser light, laser power, and/or laser pulse number used, in one example. In certain applications, such as oxide deposition or electroplating, v-shaped openings having tapered angles less than 90 degrees may allow for improved oxide coverage and/or electroplating quality.

Advantageously, laser etching of high aspect ratio openings for high aspect ratio via formation allows for increased etch rates, increased uniformity of sidewall profiles, single step etching through various layers of materials with a single laser type, and no requirement of pre-process lithography patterning. In one example, the etch rate may be less than 10 milliseconds to etch through a 400 micron thick silicon wafer.

FIG. 3(c) illustrates blind via formation by grinding and polishing of remaining substrate 40 to expose opening 41. Blind via formation may be advantageous for thermal dissipation and female die applications. It is also noted that multiple layers of materials may be laser-etched in one process step as will be illustrated with respect to FIGS. 4A-4I below.

Referring now to FIGS. 4A-4I, a first die of a wafer 100 comprising a semiconductor substrate 110 having electrical circuitry 112 formed thereon is shown. The semiconductor substrate 110 may comprise, for example, bulk silicon, doped or undoped, or an active layer of a semiconductor-on-insulator (SOI) substrate. Generally, an SOI comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

The electrical circuitry 112 formed on the semiconductor substrate 110 may be any type of circuitry suitable for a particular application. In an embodiment, the circuitry includes electrical devices formed on the substrate with one or more dielectric layers 120 overlying the electrical devices. Layer 120 is illustrated as a single layer for illustrative purposes only and may comprise a plurality of layers of different materials. Metal layers may be formed between dielectric layers to route electrical signals between the electrical devices. Electrical devices may also be formed in one or more dielectric layers.

For example, the electrical circuitry 112 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of the present disclosure and are not meant to limit the present disclosure in any manner. Other circuitry may be used as appropriate for a given application.

Figure 4A:
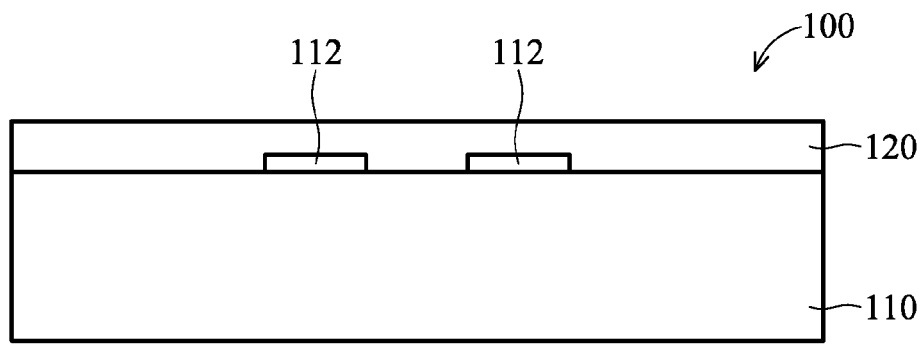
FIGS. 4A-4I illustrate sectional views of stages in forming a semiconductor device according to various aspects of the present disclosure.
Figure 4B:
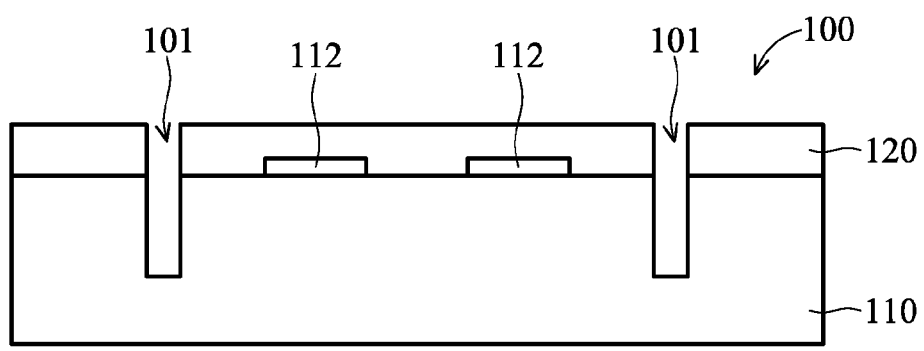

FIG. 4B illustrates laser-etched openings 101 through dielectric layer 120 and a portion of substrate 110. Openings 101 may be advantageously formed in a single process step with increased etch speed and uniformity of opening sidewalls by tuning various lasers at various controlled laser power, laser pulse number, and/or laser frequency as noted above.

Figure 4C:
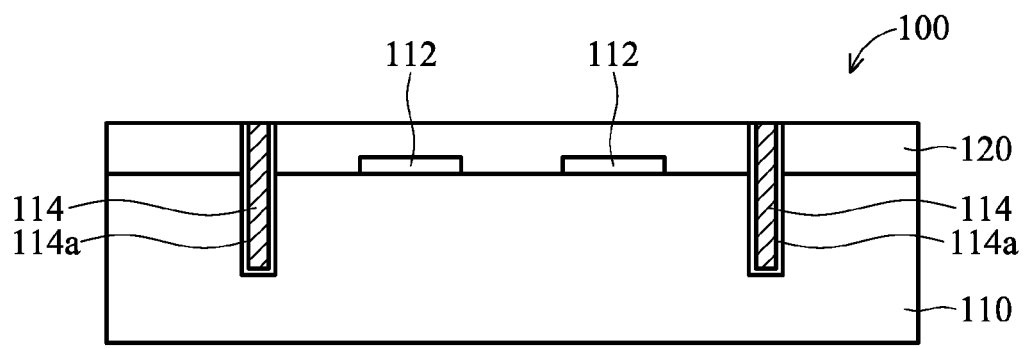

FIG. 4C illustrates through-silicon vias 114 formed by providing conductive material within laser-etched openings 101. The through-silicon vias 114 may be formed by any appropriate method. For example, in one embodiment the through-silicon vias 114 are formed after the electrical circuitry 112 is formed. In this embodiment, openings 101 are formed through dielectric layer 120 and partially through the semiconductor substrate 110. The openings 101 may be optionally lined with a liner layer 114a, such as diffusion barrier layers, adhesion layers, isolation layer, or the like, and then filled with a conductive material to form vias 114. Diffusion barrier layers may comprise one or more layers of TaN, Ta, TiN, Ti, CoW, or the like, and the conductive material comprises copper, tungsten, aluminum, silver, and combinations thereof, or the like, thereby forming the through-silicon vias 114. In an embodiment, the through-silicon vias 114 have a diffusion barrier layer of TaN and are filled with copper formed by an electro-chemical plating process in which a seed layer is deposited to aid in the formation of the conductive fill material.

Figure 4D:
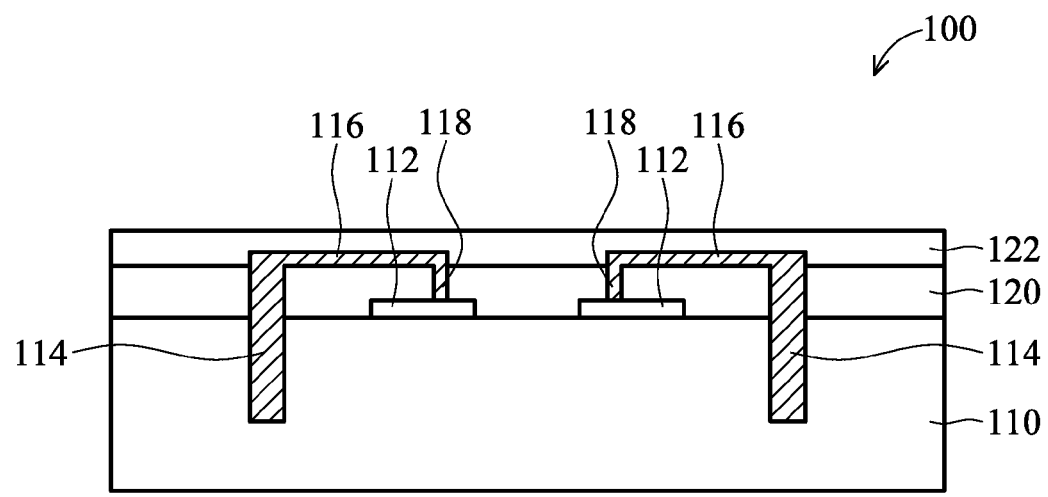

FIG. 4D illustrates the formation of redistribution lines 116. The redistribution lines 116 electrically couple the electrical circuitry 112 (via contact plugs 118) to the through-silicon vias 114. The redistribution lines 116 may be formed using common methods for forming interconnect lines in integrated circuits. For example, in an embodiment the redistribution lines 116 are fabricated by forming a layer of copper and a layer of nickel over the layer of copper through sputter, chemical vapor deposition, electrical plating, pattern electrical plating, or electroless plating, and then etching the undesired portions to form the redistribution lines 116. Other materials, such as aluminum, tungsten, titanium, combinations thereof, or the like may be used. In an embodiment, the redistribution lines 116 have a thickness between about 0.5 micron and about 30 micron. Other materials and processes, such as a well-known damascene process, could alternatively be used to form the redistribution lines 116.

The redistribution lines 116 are covered with a passivation layer 122. The passivation layer 122 comprises a high-heat resistant material in one example. It should be noted that the passivation layer 122 is illustrated as a single layer for illustrative purposes only and may comprise a plurality of layers of different materials. Suitable materials that may be used to form the passivation layer 122 include polyimide, BCB, SOG, SiOx, SiNx, SiONx, other inorganic materials, other silicon-related materials, other high thermal stable polymers, and the like.

Figure 4E:
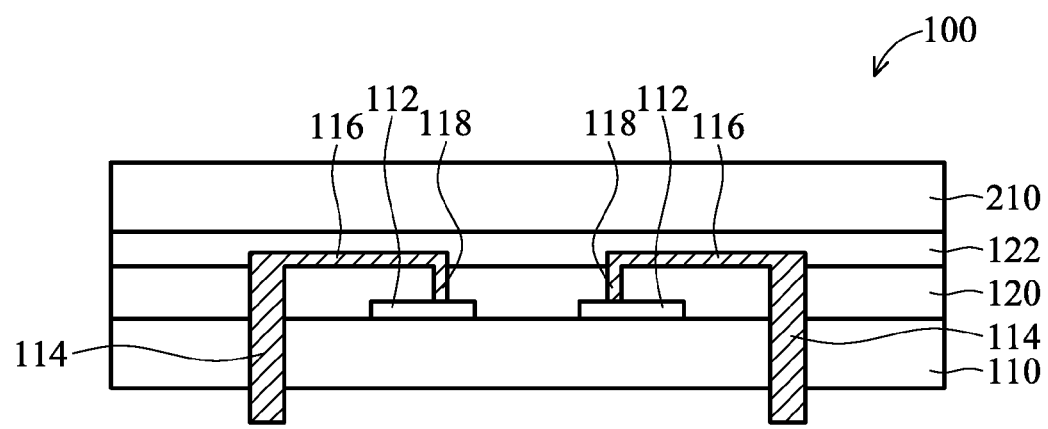

FIG. 4E illustrates the portion of the wafer 100 after a carrier wafer 210 has been attached in accordance with an embodiment of the present disclosure. Generally, the carrier wafer 210 provides temporary mechanical and structural support to the wafer 100 during subsequent processing steps. In this manner, damage to the semiconductor substrate 110 is reduced or prevented.

The carrier wafer 210 may comprise, for example, glass, silicon oxide, aluminum oxide, and the like. In an embodiment, an adhesive (not shown) is used to glue the carrier wafer 210 to a top surface of the passivation layer 122. The adhesive may be any suitable adhesive, such as an ultraviolet (UV) glue, which loses its adhesive property when exposed to UV lights. The thickness of the carrier wafer 210 is greater than about 12 millimeters in one example.

Also illustrated in FIG. 4E is the exposing of the through-silicon vias 114. In one embodiment, the through-silicon vias 114 are exposed using a combination of planarizing and etching steps. Initially, a planarizing process, such as grinding or a chemical mechanical polishing (CMP), may be performed to initially expose the through-silicon vias 114. Thereafter, an etching process may be performed to recess the semiconductor substrate 110, thereby leaving the through-silicon vias 114 protruding from the underside of the semiconductor substrate 110 as illustrated in FIG. 4E. In an embodiment in which the through-silicon vias 114 are formed of copper, the semiconductor substrate 110 may be recessed by performing a dry etch process using $HBr/O_2$, $HBr/Cl_2/O_2$, $SF_6/CL_2$, $SF_6$ plasma, or the like. In one example, about 5 micron to about 30 micron of the through-silicon vias 114 are exposed.

Figure 4F:
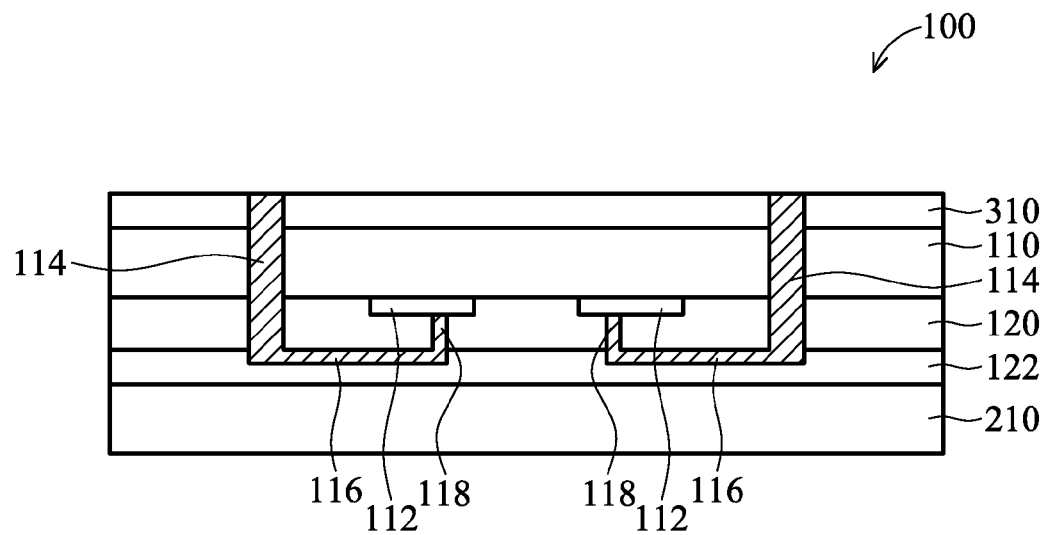

FIG. 4F illustrates the wafer 100 after a protective coating 310 has been applied in accordance with an embodiment of the present disclosure. In one embodiment, the protective coating 310 is an epoxy, gel, silicon rubber, or the like, and may be dispensed by, for example, spin-coating or printing.

The protective coating 310 is formed having a thickness sufficient to cover the exposed through-silicon vias 114. In this embodiment, a second planarizing process, such as grinding or CMP, is performed such that a substantially planar surface is formed and the through-silicon vias 114 are exposed as illustrated in FIG. 4F.

Figure 4G:
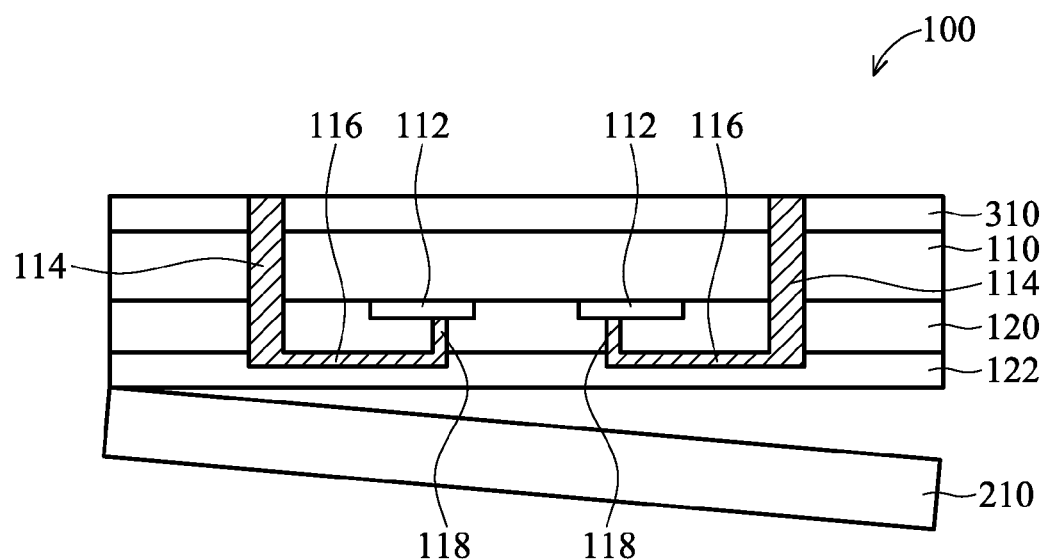

FIG. 4G illustrates the wafer 100 after the carrier wafer 210 is removed in accordance with an embodiment of the present disclosure. In an embodiment in which a UV glue is used to attach the carrier wafer 210 to the wafer 100 as discussed above, the UV glue is exposed to UV light, thereby causing the UV glue, for example, to become non-adhesive. Thereafter, the carrier wafer 210 may be easily detached. Other types of adhesive may be used, which may be released using, for example, thermal, solvent/plasma stripper, laser, or the like techniques.

Figure 4H:
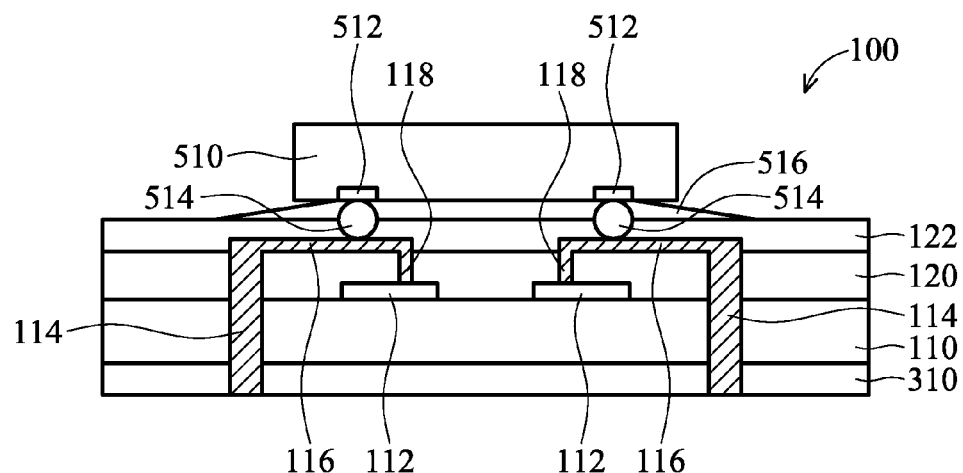

FIG. 4H illustrates the wafer 100 after a second die 510 has been attached in accordance with an embodiment of the present disclosure. It should be noted that the second die 510 is illustrated as being smaller than the first die for illustrative purposes only, and that the sizes of the first die and the second die 510 may vary such that the first die may be smaller or larger or the same size as the second die 510.

In one example, the second die 510 is electrically coupled to the first die in a flip-chip configuration such that contact pads 512 face the first die. The contact pads 512 are electrically coupled to the redistribution lines 116 via solder balls 514, which may be formed by a high-lead, eutectic, lead free solder, Cu bump, Cu/Sn, or the like.

An optional underfill material 516 may be injected or otherwise formed in the space between the second die 510 and the passivation layer 122. The underfill material 516 may, for example, comprise a liquid epoxy that is dispensed between the second die 510 and the passivation layer 122, and then cured to harden. This underfill material 516 is used, among other things, to prevent cracks from being formed in the solder balls 514, wherein cracks are typically caused by thermal stresses.

Alternatively, either a deformable gel or silicon rubber could be formed between the second die 510 and the passivation layer 122 in order to help prevent cracks from occurring within the solder balls 514. This gel or silicon rubber may be formed by injecting or otherwise placing the gel or rubber between the second die 510 and the passivation layer 122. The deformable gel or silicon rubber can provide greater stress relief.

One of ordinary skill in the art will realize that while a flip-chip configuration is discussed herein, other configurations may be used as well. For example, wire bonding may be used to electrically couple contact pads of the second die laying face up to the redistribution lines 116, as discussed below with reference to FIG. 5.

Figure 4I:
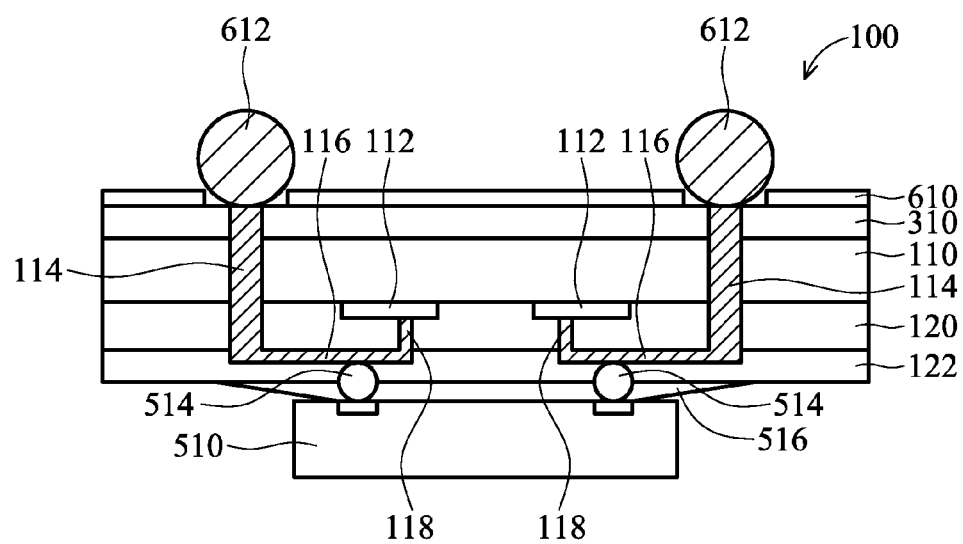

Thereafter, a solder mask 610 and second solder balls 612 may be formed in accordance with an embodiment of the present disclosure as illustrated in FIG. 4I. The solder mask 610 may be formed by depositing and patterning a solder mask material to expose contact regions of the underlying redistribution lines 116. Thereafter, the second solder balls 612 comprising a high-lead, eutectic, or lead free solder, or the like may be formed. The processes of forming and patterning a solder mask and forming solder balls are well-known in the art and, thus, are not repeated herein.

One of ordinary skill in the art will realize that the second solder balls 612 may be formed by other methods. For example, an under-bump metallization (UBM) may be deposited over the protective coating 310 and second solder balls 612 formed thereon by, for example, evaporation, electroplating, printing, jetting, stud bumping, direct placement, or the like. Furthermore, the second solder balls 612 may be formed directly on the through-silicon vias 114.

It should be noted that the redistribution lines 116 may comprise lines electrically coupling semiconductor structures formed on the first semiconductor die 110, such as electrical circuitry 112, to the through-silicon vias 114 (and to the second solder balls 612) or lines electrically coupling semiconductor structures (not shown) formed on the second semiconductor die 510 to the through-silicon vias 114 (and to the second solder balls 612). Additionally, semiconductor structures on both the first semiconductor die and the second semiconductor die 510 may be electrically coupled to the same redistribution line.

Thereafter, other back-end-of-line processing techniques suitable for the particular application may be performed. For example, an encapsulant may be formed, a singulation process may be performed to singulate individual stacked-die packages, and the like.

It should also be noted that the embodiment discussed above illustrates an embodiment in which the second die 510 is electrically coupled to the first die 130 using solder balls 514 for illustrative purposes only and that other techniques may be used. For example, FIG. 5 illustrates an embodiment in which the second die 510 is electrically coupled to the redistribution lines 116 using wire bonds 710 as is known in the art. In this embodiment, the second die 510 is attached to the first die such that the contact pads 512 on the second die 510 face away from the first die. Wire bonds 710 extend over the side of the first die and electrically couple the contact pads 512 to respective ones of the first set of redistribution lines 116.

Referring now to FIGS. 6A-6C, a second embodiment is illustrated in which double-sided redistribution lines are used to allow for greater flexibility in a pin-out configuration in accordance with an embodiment of the present disclosure. FIG. 6A assumes a wafer 200 that has been formed in a manner similar to that discussed above with reference to FIGS. 4A-4F, wherein like reference numerals refer to like elements.

Accordingly, FIG. 6A illustrates wafer 200, which corresponds to wafer 100 of FIG. 4F after backside redistribution lines 810 and a solder mask 812 have been formed, in accordance with an embodiment of the present disclosure. The backside redistribution lines 810 may be formed in a similar manner and of similar materials as the redistribution lines 116 discussed above with reference to FIG. 4D. Thereafter, the solder mask 812 may be formed in a similar manner as solder mask 610 discussed above with reference to FIG. 4I.

FIG. 6B illustrates the second die 510 attached to the wafer 200 in accordance with an embodiment of the present disclosure. The second die 510 may be attached to the wafer 800 using solder balls 514 and underfill material 516 as described above with reference to FIG. 4H.

FIG. 6C illustrates formation of solder balls 1010 in accordance with an embodiment of the present disclosure.

Other methods may also be used in this embodiment to electrically couple contact pads 512 on the second die 510 to the first redistribution lines 116. For example, FIG. 7 illustrates an embodiment in which the second die 510 of FIGS. 6A-6C is electrically coupled to the first die 130 using wire bonds 1110 as are known in the art. In this embodiment, the second die 510 is attached to the first die 130 such that the contact pads 512 on the second die 510 face away from the first die 130. Wire bonds 1110 extend over the side of the first die and electrically couple the contact pads 512 to respective ones of the first set of redistribution lines 116.

The present disclosure provides a method to fabricate a semiconductor device. In one embodiment, the method includes providing a substrate having a frontside and a backside, and providing a layer above the frontside of the substrate, the layer having a different composition from the substrate. The method further includes controlling a laser power and a laser pulse number to laser etch an opening through the layer and at least a portion of the frontside of the substrate, filling the opening with a conductive material to form a via, removing a portion of the backside of the substrate to expose the via, and electrically coupling a first element to a second element with the via.

The present disclosure provides another method to fabricate a semiconductor device. In one embodiment, the method includes providing a substrate having a frontside and a backside, and providing a plurality of layers above the frontside of the substrate, the layers having different compositions from the substrate. The method further includes controlling a laser power and a laser pulse number to laser etch an opening through the plurality of layers and at least a portion of the frontside of the substrate, wherein a taper angle of the opening is tuned by the laser power and the laser pulse number. The method continues with filling the opening with a conductive material to form a via, removing a portion of the backside of the substrate to expose the via, and electrically coupling a first element to a second element with the via.

The present disclosure also provides a semiconductor device. In one embodiment, the semiconductor device includes a first die having a first surface and a second surface opposite the first surface, and a plurality of vias formed through a plurality of openings laser-etched through the first surface of the first die, each opening of the plurality of openings having an aspect ratio ranging between about 0.25 and about 20. The device further includes a first set of redistribution lines electrically coupling semiconductor components of the first die to the plurality of vias, and a second die having a first surface and a second surface opposite the first surface. The first surface of the second die has contact pads, the first set of redistribution lines electrically coupling the contact pads of the second die to the plurality of vias.

It is understood that additional processes may be performed to complete the fabrication of the semiconductor device. For example, these additional processes may include deposition of passivation layers, formation of contacts, and formation of interconnect structures (e.g., lines and vias, metal layers, and interlayer dielectric that provide electrical interconnection to the device including the formed metal gate). For the sake of simplicity, these additional processes may not be necessarily described herein.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, the method comprising:
   providing a substrate having a frontside and a backside;
   providing a layer above the frontside of the substrate, the layer having a different composition from the substrate and containing a first electrical element;
   controlling a laser power and a laser pulse number to laser etch an opening through the layer and at least a portion of the frontside of the substrate;
   completely filling the opening with a conductive material to form a via;
   forming a passivation layer over the frontside of the substrate, the passivation layer containing electrical interconnection component that electrically couples the first electrical element to the via;
   bonding a carrier substrate to the substrate, the passivation layer being disposed between the substrate and the carrier substrate;
   removing, after bonding the carrier substrate, a portion of the backside of the substrate to expose the via;
   thereafter removing the carrier substrate; and
   electrically coupling the first electrical element to a second element on the backside through the via.

2. The method of claim 1, wherein the substrate is comprised of silicon, gallium arsenide (GaAs), gallium nitride (GaN), ceramic, sapphire, a dielectric, or combinations thereof, and wherein the conductive material includes copper, tungsten, aluminum, silver, or combinations thereof.

3. The method of claim 1, wherein the laser etch is performed with the laser power between about 1 milliwatt and about 100 kilowatts.

4. The method of claim 1, wherein the laser etch is performed with the laser pulse number between about 1 and about 300.

5. The method of claim 1, wherein the opening is laser etched without using a resist mask.

6. The method of claim 1, wherein the opening is laser etched to have a diameter ranging between about 40 micron and about 140 micron and a depth ranging between about 10 micron and about 800 micron.

7. The method of claim 1, wherein the opening is laser etched to have an aspect ratio ranging between about 0.25 and about 20.

8. The method of claim 1, wherein the first electrical element is a first semiconductor component of a first die and the second element is a second semiconductor component of a second die.

9. The method of claim 1, further comprising forming a liner layer in the opening, the liner layer comprised of a material selected from TaN, Ta, TiN, Ti, CoW, or combinations thereof.

10. The method of claim 1, further comprising tuning the laser power, a laser frequency, and the laser pulse number to control a taper angle of the opening, and wherein the taper angle is between about 60 degrees and about 90 degrees.

11. A method of fabricating a semiconductor device, the method comprising:
   providing a substrate having a frontside and a backside;
   providing a plurality of layers above the frontside of the substrate, the plurality of layers having different compositions from the substrate;
   controlling a laser power and a laser pulse number to laser etch an opening through the plurality of layers and at least a portion of the frontside of the substrate, wherein a taper angle of the opening is tuned by the laser power and the laser pulse number;
   filling a substantial entirety of the opening with a conductive material to form a via;
   bonding a carrier substrate to the frontside of the substrate;
   removing, after bonding the carrier substrate, a portion of the backside of the substrate to expose the via;
   thereafter removing the carrier substrate; and
   electrically coupling a first element to a second element with the via.

12. The method of claim 11, further comprising grinding and polishing a backside of the substrate to expose the via.

13. The method of claim 11, further comprising laser etching a plurality of openings through at least a portion of the substrate, wherein the plurality of openings are etched with different laser power or different laser pulse numbers.

14. A method of fabricating a semiconductor device, the method comprising:
   providing a first die having a first surface and a second surface opposite the first surface;
   providing a second die having a first surface and a second surface opposite the first surface, the first surface of the second die having contact pads;
   laser etching a plurality of openings through the first surface of the first die, each opening of the plurality of openings having an aspect ratio ranging between about 0.25 and about 20;
   thereafter completely filling the openings with a conductive material to form a plurality of vias;
   bonding a carrier to the first surface of the first die;
   polishing, after bonding the carrier, the first die from the second surface until the vias are exposed;
   thereafter removing the carrier; and
   electrically coupling semiconductor components of the first die to the plurality of vias and to the contact pads of the second die through a first set of redistribution lines.

15. The method of claim 14, wherein each opening of the plurality of openings is formed through layers of different material.

16. The method of claim 14, wherein each opening of the plurality of openings includes a tapered profile having a taper angle between about 60 degrees and about 90 degrees.

17. The method of claim 14, wherein each opening of the plurality of openings has a diameter ranging between about 40 micron and about 140 micron and a depth ranging between about 10 micron and about 800 micron.

18. The method of claim 14, wherein the plurality of vias are comprised of conductive material including copper, tungsten, aluminum, silver, or combinations thereof, and wherein each via of the plurality of vias includes a liner layer, the liner layer comprised of material selected from TaN, Ta, TiN, Ti, CoW, or combinations thereof.

19. The method of claim 8, wherein the substrate and the via are portions of the first die, and wherein the electrically coupling is performed such that the second die is coupled to the first die through the frontside of the substrate.

20. The method of claim 11, wherein the electrically coupling is performed such that a first die containing the first element is electrically coupled to a second die containing the second element, wherein the substrate and the via are located on the first die, and wherein the second die is coupled to the first die through the frontside of the substrate.

21. The method of claim 11, wherein the first element is disposed within one of the layers above the frontside of the substrate, and further comprising forming a laterally-extending electrical interconnection component over the frontside of the substrate to electrically couple the via with the first element.

* * * * *